United States Patent [19]

Furumiya

[11] Patent Number: 5,742,081
[45] Date of Patent: Apr. 21, 1998

[54] CHARGE TRANSFER IMAGE PICKUP DEVICE

[75] Inventor: Masayuki Furumiya, Tokyo, Japan

[73] Assignee: NEC Corporation, Japan

[21] Appl. No.: 383,820

[22] Filed: Feb. 6, 1995

[30] Foreign Application Priority Data

Feb. 16, 1994 [JP] Japan .................................. 6-019350

[51] Int. Cl.[6] .................................................. H01L 27/148
[52] U.S. Cl. ........................ 257/232; 257/222; 257/225; 257/229; 257/233; 257/249; 257/250; 257/443
[58] Field of Search ................................. 257/222, 223, 257/225, 229, 232, 233, 240, 249, 250, 435, 443, 219, 220, 221

[56] References Cited

U.S. PATENT DOCUMENTS 5,323,034   6/1994   Furumiya ............................ 257/232

FOREIGN PATENT DOCUMENTS 62-296463   12/1987   Japan ............................ 257/240
4258168    9/1992   Japan ............................ 257/229

*Primary Examiner*—Minh-Loan Tran
*Attorney, Agent, or Firm*—Hayes, Soloway, Hennessey, Grossman & Hage, P.C.

[57] ABSTRACT

A charge transfer image pickup device is disclosed. One embodiment of the device includes a plurality of photoelectric conversion elements for producing signal charges in response to light applied thereto. A vertical charge transfer part including a first region having a first well layer and for transferring the signal charges produced by the photoelectric conversion elements is provided. A horizontal charge transfer part including a second region having a second well layer and coupled to the vertical charge transfer part to receive transferred signal charges by using a terminal vertical transfer electrode of the vertical charge transfer part is also included. The first and second well layers partially overlap to form an overlap section that does not extend over the terminal vertical transfer electrode in the direction from the second region to the first region. A barrier layer is selectively formed in the first region such that the potential profile of the device descends gradually in the direction from the first region to the second region.

14 Claims, 14 Drawing Sheets

5,742,081

CHARGE TRANSFER IMAGE PICKUP DEVICE

BACKGROUND OF THE INVENTION

1. Field of the Invention

The present invention relates to a solid state imaging device and, more particularly, to a solid state imaging device employing a charge coupled device (CCD) and a method for producing the same.

2. Brief Description of Related Prior Art

A two-dimensional CCD solid state image pickup device used in an imaging apparatus such as a camera is classified in general into a frame interline type in which signal charges are temporarily stored into a memory region and then read out therefrom (referred to as "FITCCD apparatus" hereunder), and an interline type in which no memory region is provided and signal charges are thus read out sequentially from a charge transfer part (referred to as "ITCCD apparatus"). These two types of apparatuses are alternatively employed in accordance with application field.

Recently, a great effort has been devoted to the development of a two-dimensional CCD solid state image pickup apparatus in preparation for the so-called HDTV system, or one of high-definition television systems.

FIG. 8 is a plan view showing an outline of a conventional HDTV-ready FITCCD apparatus, while FIG. 9 is a plan view showing details of connections between vertical CCDs and horizontal CCDs. A plurality of photoelectric conversion sections 1 each corresponding to a pixel are placed in a matrix. The pixels are separated from each other by isolation regions 7. Placed between the adjacent columns of the photoelectric conversion sections 1 is a vertical CCD 3 having a readout or transfer gate 2 coupled to the associated pixels 3. The output ends of the vertical CCDs 3 are connected respectively to vertical CCDs 4 each serving as a memory region. The memory region includes neither a photoelectric conversion section 1 nor a readout gate 2, but is equipped with vertical CCD transfer electrodes 11a and 11b. The output ends of the memory vertical CCDs 4 are connected to horizontal CCDs 5 via terminal electrodes 8 and transfer gates 9. Placed at output ends of the horizontal CCDs 5 are charge- sensing sections 6 which output signal charges as picture or video signals. All of the vertical CCDs 3, vertical CCDs 4 and horizontal CCDs 5 are formed in a p-type well layer 23, and the vertical CCD transfer electrodes 11a, 11b and horizontal CCD transfer electrodes 12a, 12b are placed above them, respectively. The vertical CCD transfer electrodes in the image pickup region, however, are not shown to avoid complexity.

The operation will now be explained. The light which has struck the image pickup region for a given period is converted by and accumulated in the photoelectric conversion sections 1 as signal charges in an amount which depends on the amount of light. The readout gates 2 are switched on during a vertical blanking interval, and the signal charges are read into the corresponding vertical CCDs 3 in the pickup region. Then, driving pulses at several hundred kHz to 1 MHz are applied to the vertical CCD transfer electrodes (not shown); with each application a single row (one-line-equivalence) of signal charges of transfer electrodes undergo successive, parallel transfer to the vertical CCDs 4 in the memory region. Thereafter, during a horizontal blanking interval, driving pulses are applied to the vertical CCD transfer electrodes 11a and 11b for the vertical CCDs 4 in the same manner, thereby transferring the signal charges successively on a row-by-row basis to the horizontal CCDs in response to a driving frequency of 100–300 kHz. The horizontal CCDs 5 transfer the signal charges transferred from the vertical CCDs 4 to the charge-sensing sections 6 row by row and successively at 37–74 MHz using the horizontal CCD transfer electrodes 12a and 12b. The charge-sensing sections 6 convert the signal charges to voltages which are outputted as time series video signals.

The HDTV system requires 1.3–2 million pixels or 5–8 times the number required by current standard television systems (e.g., the NTSC system). However, arrangement of more pixels 1 has caused reductions in unit pixel area because the device itself cannot be enlarged. This results in a reduced area of the photoelectric conversion section which in turn leads to desensitization. In addition, since the area of the vertical CCDs 3 is also reduced, the maximum amount of signal charges to be transferred decreases accordingly, thus limiting the dynamic range of the image pickup apparatus. The area of the photoelectric conversion section may be increased to make it more sensitive, but this results in a correspondingly reduced area of the vertical CCDs.

For this reason, there now exists a need to increase the largest possible amount of charges to be transferred per unit area of the vertical CCDs. As a solution, the inventors of the present invention (hereunder, "the present inventors") attempted to design a p-type well layer 23 separately for the vertical CCDs and the horizontal CCDs which have been arranged in a single p-type well layer. More specifically, in order to ensure a maximum amount of charges to be transferred per unit area of the vertical CCDs 3 and the vertical CCDs 4, it was attempted to form the p-type well layer with a high impurity concentration and a small junction depth. However, since a higher impurity concentration weakens the electric field in the direction of charge transfer, the charges are blocked from transfer at a high speed; the trade-off is this blocking from high-speed transfer for increase in the impurity concentration. On the other hand, since the horizontal CCDs 5 are transferred at a frequency of 37–74 MHz as mentioned above, it becomes necessary to perform a high-speed operation 2–4 times that according to the HTSC system. Therefore, the p-type well layer was constructed with a decreased impurity concentration and an increased junction depth in order to intensify the electric field in the direction of charge transfer so that a high degree of transfer efficiency of the horizontal CCDs 5 is established even for high-speed transfer.

FIG. 10 is a plan view showing connections between vertical CCDs and horizontal CCDs of a conventional FITCCD apparatus for each of which a p-type well layer is provided. FIG. 11(a) is a cross-sectional view taken on line D—D' in FIG. 10. FIG. 11(b) is an illustration showing the potential profile across the cross section. To avoid complexity, the vertical CCD transfer electrodes 11a and 11b and the horizontal CCD transfer electrodes 12a are not shown in FIG. 10. The p-type well layer 16 at the side of the vertical CCDs are formed over the image pickup region and the memory region, and its front extends to the transfer gates 9. On the other hand, the p-type well layer 15 at the side of the horizontal CCDs, being connected to and overlapping with the p-type well layer 16, extends to the terminal vertical CCD electrodes 8 (FIG. 10). As is apparent from the sectional configuration shown in FIG. 11(a), the p-type well layer 16 and the p-type well layer 15 are formed on a main surface of the N-type semiconductor substrate 14, and a N-type embedded layer is overlaid thereon. Terminal vertical CCD electrodes 8 and transfer gates 9 are provided adjacent to each other, with intervening insulating films. Multistage vertical CCD transfer electrodes for the vertical CCDs 4 are arranged to the right of the terminal vertical CCD electrodes 8. Located to the left of the transfer gates 9 are horizontal CCDs 5, and multistage horizontal CCD transfer electrodes are arranged in the direction of the normal to the plane of the paper. For example, the p-type well layer 16 may have an impurity concentration of $5\times10^{15}$–$1\times10^{16}$ cm$^{-3}$ and a junction depth of 2–3 μm, whereas the p-type well layer 15 may have an impurity concentration of $1\times10^{15}$–$2\times10^{15}$ cm$^{-3}$ and an junction depth of 4–5 μm. With these different well layers overlapped, however, a potential barrier on the order of 0.5 volts is produced in contrast to the case of a single well layer, as shown in FIG. 11(b). When viewed in the direction of charge transfer, the potential ascends sharply to its peak across the overlap section and descends to lower potentials. Transfer of the signal charges from the vertical CCDs 4 to the horizontal CCDs 5 involves overcoming the potential barrier. Nevertheless, electrons cannot travel across potential differences greater than their thermo-electromotive force (26 mV) at ordinary temperatures. Accordingly, the potential barrier of as high as 0.5 volts cannot be overcome, resulting in transfer failure of the signal charges.

In view of the foregoing, the present inventors proposed an improved CCD apparatus which decreases the apparent potential barrier to 26 mV or less. This CCD apparatus is disclosed in U.S. Pat. No. 5,323,034 field on Apr. 15, 1993 and issued on Jun. 21, 1994. In brief, the overlap section of the well layers is lengthened with a concentration gradient to moderate the potential gradient, thereby decreasing the potential difference shared by each transfer electrode to 26 mV or less. More specifically, many transfer electrodes are employed to transfer the signal charges as if by relays so that they travel across the 0.5-volt potential barrier. To accomplish this, the memory region is constructed in such a manner that the well layer for the horizontal CCDs tapers toward the vertical CCDs and deeply burrows its way into the other well layer, immediately under the transfer electrodes.

FIGS. 12 and 13 are plan views of details of connections between the vertical and horizontal CCDs disclosed in the above Patent. A comparison with FIG. 10 reveals the difference that the p-type well layer 15 is replaced by a p-type well layer 13 tapered so that it deeply burrows its way toward the vertical CCDs. The p-type well layer 13 is identical with the p-type well layer 15 in the horizontal CCD region, but branches in the vicinity of the transfer gates 9, and the resulting branches taper to match the corresponding vertical CCDs 4. The length L of the distance from the branching points to the fronts is determined so that the potential difference shared by a single stage transfer electrode becomes 26 mV or less (FIG. 12). FIG. 13 is a superimposed view of the vertical transfer electrodes 11a and 11b in the memory region upon FIG. 12.

FIG. 14(a) is a cross-sectional view taken on line B—B' in FIG. 12. The p-type well layer 16 is the same as the foregoing one. The impurity concentration and junction depth of the p-type well layer 13 is the same as of the above p-type well layer 15 in the region of the horizontal CCDs 5. However, as it burrows its way deeply toward the vertical CCDs by the length L when measured horizontally from the branching point, the junction depth becomes smaller and the impurity concentration reduced. The reason for the reduction in the impurity concentration which is uniform throughout the well layer at the time of ion-implantation of a p-type impurity is that the impurity diffuses into the surroundings by thermal processing due to the tapered fronts.

The length L of the tapering sections may be tens to hundreds of μm depending on the length of the transfer electrode gates. Supposing that the potential difference of a single stage transfer electrode is 20 mV, all that is needed is 25 or more transfer electrodes, or 13 or more pixels. The length L in this case is approximately 100 μm. Since a one-inch-format HDTV-ready FITCCD apparatus accumulates signal charges for 250 pixels and is equipped with twice the number of the pixels, or 500 transfer electrodes in the memory region, provision of a 100-μm piece of overlap section does not present any problem. As a result, the signal charges were transferred to the horizontal CCDs across the 0.5-volt potential barrier. FIG. 14(b) is an illustration showing the potential profile.

Incidentally, IFTCCD apparatus need a memory region in addition to an image pickup region. Although no photoelectric conversion section is provided in the memory region, vertical CCD transfer electrodes are required in the memory region as in the image pickup region, which causes an increase in chip size. Accordingly, the number of chips prepared from a single wafer decreases, and an increased number of rejects tend to be produced, which generate disturbed images due to blemishes resulting from contamination with particles during preparation, or from nonuniformity of the respective devices, which defects are further accompanied by disadvantages including poor performance and lowered yield of the CCD apparatuses. This naturally leads to an increase in the cost.

Conversely, since ITCCD apparatuses have no memory region, the chip may be made more compact. Therefore, the number of chips per wafer increases greatly. In addition, since the memory region does not need any vertical CCD transfer electrodes, it becomes easier to establish uniformity of the process of preparation of chips which are less affected by particles, resulting in an improved yield of chips. Thus, there are provided the merits of lower cost and thus marketing of cheaper products.

For the foregoing reasons, it is desired that ITCCD apparatuses, as well as FITCCD apparatuses, have well layers designed separately for vertical CCDs and horizontal CCDs to accomplish high degrees of transfer efficiency even for high-speed transfer. Nevertheless, since ITCCD apparatuses have no memory region, they cannot afford provision of a tapered section with a sufficient length to avoid transfer failure.

FIG. 5 is a plan view showing an outline of an ITCCD apparatus. The Vertical CCDs 3 in the image pickup region are directly connected to the horizontal CCDs 5 without linkage by a memory region.

FIG. 6 is a plan view showing connections between the vertical CCDs and horizontal CCDs. ITCCD apparatuses have no memory region, but usually have several stages of transfer electrodes 25a and 25b between the image pickup region and terminal vertical CCD electrodes 8. In cases where a tapered section of the p-type well layer 26 is arranged in the region for these transfer electrodes, the length L of the tapered section is on the order of 50 μm at the most. This is because the number of stages of the transfer electrodes is determined on the basis of the number of lines which may be subjected to blank transfer during a vertical blanking interval. The vertical blanking interval is determined by the television system and the number of effective scanning lines. The number of stages of the transfer electrodes to be provided is approximately 10 at the most. In order to minimize the gradient of the potential barrier across the tapered section to the extent necessary to avoid transfer failure, however, L is required to be 100 μm or longer. Nevertheless this length cannot be ensured due to the restricted number of stages of the transfer electrodes. As the result, the potential difference for a single stage transfer electrode becomes 26 mV or more and causes transfer failure (FIG. 7).

If L is ensured to be 100 μm or more by opening up the spaces between the transfer electrodes, then failure will definitely be avoided. The increased spacing, however, causes not only a corresponding increase in chip size, but also a corresponding decrease in transfer speed. This nullifies the advantages of the ITCCD apparatus.

The tapered section, then, may be extended up to the vertical CCDs 3 in the image pickup region. In this case, the p-type impurity in the tapered section diffuses into the image pickup region, resulting in a nonuniform impurity profile across the image pickup region. As a result, the sensitivity cannot be constant, and this flaw is fatal to image pickup apparatuses.

SUMMARY OF THE INVENTION

It is an object of the present invention to avoid transfer failure with ITCCD apparatuses, without spoiling their advantages.

A solid state image pickup device according to one aspect of the present invention comprises: a matrix of a group of image pickup devices arranged on a semiconductor substrate which convert light into charges; a group of vertical charge transfer devices which comprise a first unilateral conductive region formed between the columns of the image pickup device group and a plurality of gate electrodes provided thereabove, and thereby transferring a group of the generated charges row by row in a vertical direction; and a group of horizontal charge transfer devices which comprise a second unilateral conductive region connected to the terminal of the vertical charge transfer device group in their transfer direction and a plurality of gate electrodes provided thereabove, and thereby transferring the charge transferred from the vertical charge transfer device group, column by column in a horizontal direction; and is characterized by the structure of the overlap region between the first region and the second region wherein the potential descends gradually in the direction from the first region to the second region.

A solid state image pickup device according to another aspect of the present invention comprises, a matrix of a group of image pickup devices arranged on a semiconductor substrate which convert light into charges; a group of vertical charge transfer devices which comprise a first unilateral conductive region formed between the columns of the image pickup device group and a plurality of gate electrodes provided thereabove, and transfer a group of the generated charges row by row in a vertical direction; and a group of horizontal charge transfer devices which comprise a second unilateral conductive region connected to the terminal of the vertical charge transfer device group in their transfer direction and a plurality of gate electrodes provided thereabove, and thereby transferring the charge transferred from the vertical charge transfer device group, column by column in a direction orthogonal to the vertical direction; and is characterized by placement of a barrier layer which lowers the potential across the overlap region between the first region and the second region gradually in the direction from the first region to the second region, between the vertical charge transfer group and the horizontal charge transfer device group.

According to still another aspect of the present invention, there is provided a solid state image pickup device which comprises a first reverse conductive well layer having a first impurity concentration and a first junction depth, and a second reverse conductive well layer having a second impurity concentration lower than the first impurity concentration and a second junction depth greater than the first junction depth on a unilateral conductive semiconductor substrate, and the first and second well layers overlap with each other, and transfer charges in the direction from the first well layer to the second well layer; and is characterized by provision of a structure at a position corresponding to the peak of the potential across the overlap section between the first and second well layers, which lowers the potential gradually in the direction of charge transfer.

A method for producing a solid state image pickup device according to the present invention comprises the steps of forming a first unilateral conductive region in a given region in a semiconductor substrate; forming a second unilateral conductive region which partially overlaps with the first region; forming a third reverse conductive region on the first region and the second region; forming oxide film gates above the third region; forming a first group of discrete vertical transfer gates above the first region; forming a second group of vertical transfer gates which alternate with and are insulated from the vertical transfer gates of the first group; and a step of forming a barrier layer which is self-matched with ends of the transfer gates of the first group at the side of the second region which are closest to the second region, and is adapted to lower the potential across the overlap region gradually in the direction from the first region to the second region, under the transfer gates of the second group at the side of the second region which abut the transfer gates of the first group.

A process for preparation of a solid state image pickup device according to another aspect of the present invention comprises the steps of forming a first unilateral conductive region in a given region in a semiconductor substrate; forming a second unilateral conductive region which partially overlaps with the first region; forming a third reverse conductive region on the first region and the second region; forming oxide film gates above the third region; forming a first group of discrete vertical transfer gates above the first region; forming a second group of vertical transfer gates which alternate with and are insulated from the vertical transfer gates of the first group; forming a first group of discrete horizontal transfer gates above the second region; forming a second group of horizontal transfer gates which alternate with and are insulated from the horizontal transfer gates of the first group; and forming a barrier layer immediately under the first horizontal transfer gate group and immediately under the vertical gates which are closest to the second region.

BRIEF DESCRIPTION OF THE DRAWINGS

The above and other objects, features and advantages of the present invention will become more apparent from the following description taken in conjunction with the accompanying drawings, wherein:

FIGS. 1(a) and 1(b) are the schematic views showing an embodiment according to the present invention, wherein FIG. 1(a) is a plan view showing connections between the vertical CCDs and horizontal CCDs, while FIG. 1(b) is a cross-sectional view taken on line A—A' in FIG. 1(a).

FIGS. 11(a) and 11(b) are the schematic views of a conventional FITCCD apparatus, wherein FIG. 11(a) is a cross-sectional view taken on line D—D' in FIG. 10, while FIG. 11(b) shows a potential profile;

FIGS. 14(a) and 14(b) are the schematic plan views of a conventional FITCCD apparatus, wherein FIG. 14(a) is a cross-sectional view taken on line B—B' in FIG. 12, while FIG. 14(b) shows a potential profile;

FIGS. 15(a) and 15(b) are these views showing the structure of embodiment 3 according to the present invention, wherein FIG. 15(a) is a plan view showing connections between the vertical CCDs and the horizontal CCDs, and FIG. 15(b) is a cross-sectional view taken on line E—E' in (a);

In these figures, the same reference characters depict the same parts, respectively.

DETAILED DESCRIPTION OF THE PREFERRED EMBODIMENTS

Figure 1:
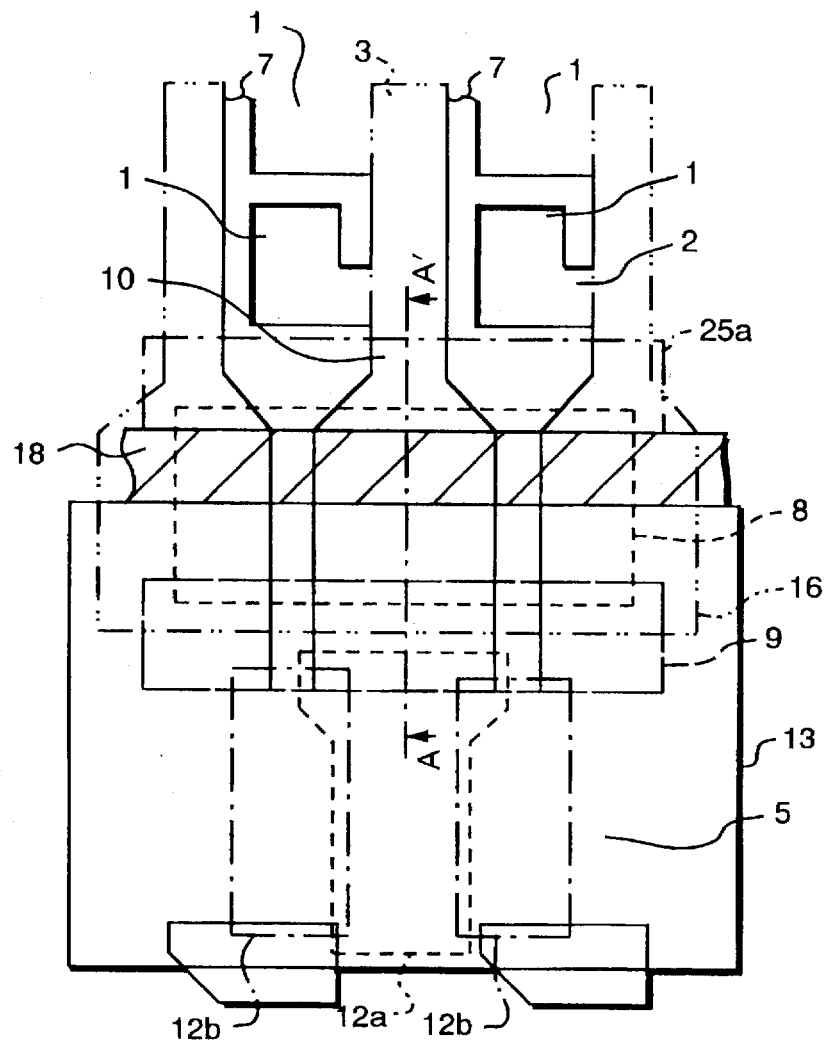
Figure 1:
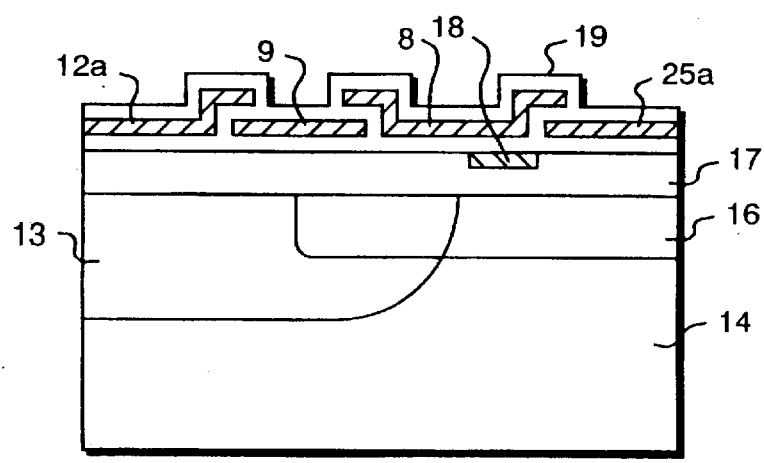

FIG. 1(a) is a plan view showing connections between the vertical CCDs and horizontal CCDs of Embodiment 1 according to the present invention. A plurality of photoelectric conversion elements 1 compartmented by isolation regions 7 are placed in a matrix and connected to the abutting vertical CCDs 3 via readout or transfer gates 2. The vertical CCDs 3 are placed between the columns of the photoelectric conversion sections 1. The foregoing is a summary of the image pickup region.

Output ends of the vertical CCDs 3 are connected to multistage transfer electrodes 25a (only one stage is shown for simplicity) and then to horizontal CCDs 5 via terminal vertical CCD electrodes 8 and transfer gates 9. Output ends of the horizontal CCDs 5 are connected to charge-sensing sections 6 (not shown). By gradually increasing the widths of transfer channels for the vertical CCDs 3 compartmented by the device-separating regions 7 by provision of channel-width-enlarged portions 10 increasing widthwise toward the terminal vertical CCD electrodes 8, the potential may be made lower than in the cases where the widths are increased stepwise, without tapering. The p-type well layer 16 for the vertical CCDs 3 are arranged extending from the vertical CCDs 3 in the image pickup region to the transfer gates 9. The p-type well layer 13 for the horizontal CCDs 5 extends from the horizontal CCDs 5 to the terminal vertical CCD electrodes 8, and the planar form of its front is not tapered, but remains straight. As a result, the overlap section between the p-type well layer 16 and the p-type well layer 13 has a rectangular planar form whose length L is on the order of 10 μm. In addition, the region between the edge of the p-type well layer 13 and the edges of the terminal vertical CCD electrodes at the side of the vertical CCDs 3 has a rectangular barrier layer 18 across the transfer channels.

As shown in FIG. 1(b) which is a cross-sectional view taken on line A—A' in FIG. 1(a), there are provided two p-type well layers 13 and 16 in an n-type semi-conductor substrate 14. The two p-type well layers 13 and 16 overlap each other under the transfer gates 9 and the terminal vertical CCD electrodes 8. As is shown, the well layer 13 is deeper than the well layer 16. Placed on the two p-type well layers is an n-type buried layer 17 having an impurity concentration of $7 \times 10^{16} - 3 \times 10^{17}$ cm$^{-3}$ and a junction depth of 0.3-1.0 μm, for construction of embedded channels. Then, a barrier layer 18 with an impurity concentration of $5 \times 10^{16} - 1 \times 10^{17}$ cm$^{-3}$ is provided in the top portion of the n-type buried layer 17, with a smaller depth than the latter, substantially at the side of the vertical CCDs with respect to the well overlap section and under the terminal vertical CCD electrodes 8. Provided on the surfaces of the layers, via an insulating film, are electrodes including transfer electrodes 25a, terminal vertical CCD electrodes 8, transfer gates 9 and horizontal CCD transfer electrodes 12a. An insulating film 19 is provided between and on the surfaces of the respective electrodes.

The operation of the members will now be explained. Light which has struck the image pickup region for a given period of time is converted into and accumulated as signal charges in an amount which depends on that of light in the photoelectric conversion sections 1. Once the readout gates 2 are set to the ON position and the signal charges are read into the vertical CCDs 3, the vertical CCDs 3 transfer the signal charges of a frequency of the order of a few hundred kHz to 1 MHz to the horizontal CCDs 5 in succession. Transfer of the signal charges is accomplished by repeating operations which involve application of voltages to the respective electrodes and control of potentials to electrons so as to lower them in the direction of transfer, thereby making the signal charges travel toward lower potentials.

Figure 2:
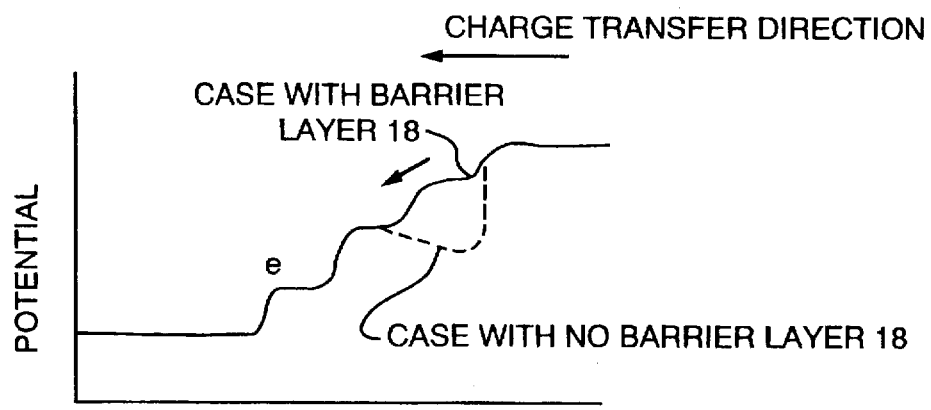
FIG. 2 is a view showing a potential profile which represents the effects of the present invention.

FIG. 2 shows the potential profile across the well overlap section upon transfer of the signal charges. In cases where no barrier layer 18 is provided, the potential profile in the direction of charge transfer, as shown by the broken line, falls sharply once, slants upward and then falls again. The charges are entrapped in the region corresponding to the first falling and blocked from transfer. By provision of the barrier layer 18, however, since the potential gradually decreases in the transfer direction without falling sharp, no charge is entrapped. In this way blocking from transfer does not occur even in the well overlap section. Further, in cases where channel-width-enlarged portions 10 are provided for the vertical CCDs 3, the potential profile is lowered much more than in non-tapered cases. The signal charges are transferred to the horizontal CCDs 5, converted into voltages in the charge-sensing sections 6 and outputted as time series video signals.

Figure 3:
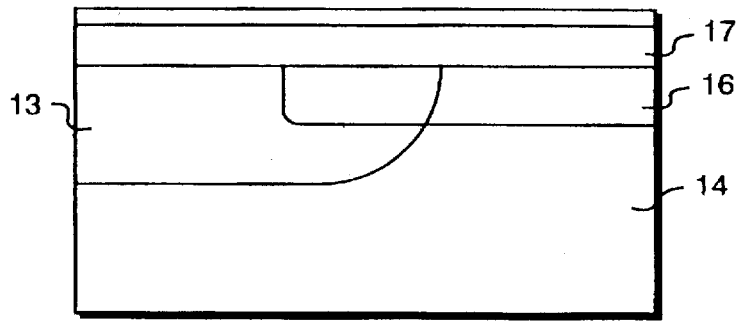
FIGS. 3(a) and 3(b) are the cross-sectional views of the well overlap section of an embodiment according to the present invention and its vicinity, illustrative of the process for the preparation thereof.
Figure 3:
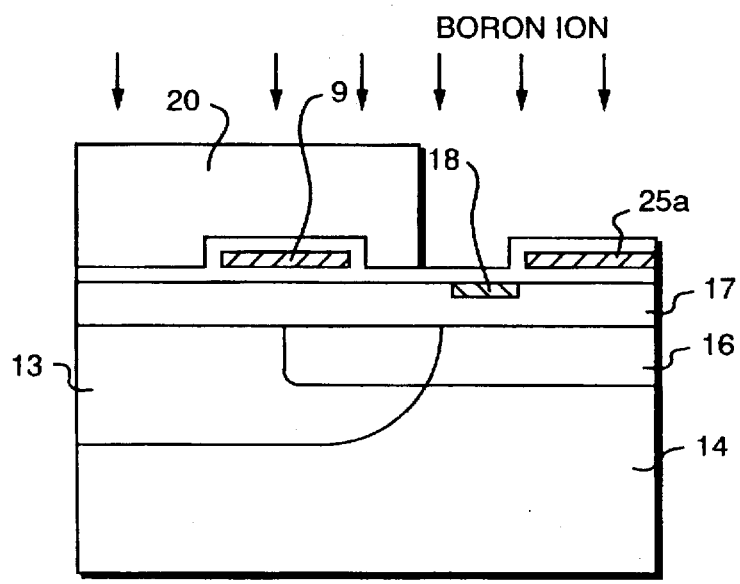

A process for the preparation of the apparatuses will now be explained with reference to FIG. 3, which shows the well overlap section and its vicinity. A resist pattern is formed on a main surface of an N-type semi-conductor substrate 14, and using that as the mask a p-type impurity, e.g., boron, is subjected to ion-implantation to form a p-type well layer 16. Another resist pattern is formed and used as the mask for the formation of another p-type well layer 13 by ion-implantation of a p-type impurity, e.g., boron. Then, an N-type buried layer 17 is formed by ion-implantation of, e.g., phosphor or arsenic into the entire surface. Thereafter, oxide film gates 27 are formed on the surface (FIG. 3(a)). Subsequently, a first layer of polysilicon is applied over the entire surface and patterned to form transfer gates 9. The polysilicon is separately patterned to form either counterparts each of the vertical and horizontal CCD transfer electrodes—that is, the vertical CCD transfer electrodes 11a, transfer electrodes 25a and horizontal CCD transfer electrodes 12a. The entire surface is coated with an insulating film, and a resist pattern is formed which covers all but the region intended for the formation of a barrier layer 18. In this connection, the resist pattern is formed in such a manner that the edges of the transfer electrodes 25a at the horizontal CCD side are exposed. Ion-implantation of boron is performed into the surface of the N-type buried layer 17 to compensate the impurity in the buried layer 17 with reverse conductive boron, thereby forming a barrier layer 18 with a low impurity concentration (FIG. 3(b)). The p-type well layers 13 and 16, n-type embedded layer 17 and barrier layer 18 have the above-mentioned impurity concentrations and junction depths. After the resist is peeled off, a third layer of polysilicon is applied over the entire surface and patterned to form the remaining counterparts of the vertical and horizontal CCD transfer electrodes—that is, the vertical CCD transfer electrodes 11b, transfer electrodes 25b and horizontal CCD transfer electrodes 12b. The edge of the barrier layer 18 at the vertical CCD side is formed while self-matching with the edges of the transfer electrodes 25a, and eventually self-matching with the terminal vertical CCD electrodes. Thereafter, the entire surface is coated with an insulating film (FIG. 1(b)). In the above embodiment, polysilicon is used as the electrode material which, however, may be a metallic material such as aluminum or an alloy of a metal and silicon.

The foregoing explanation of the construction and preparation process is based on one-channel-system horizontal CCDs. However, there are many cases of two-channel-system CCDs as well. In such cases, a structure is provided wherein a horizontal CCD barrier layer is arranged on the surface of the N-type embedded layer 17 under the horizontal CCD transfer electrodes 12b. Accordingly, simultaneous formation of the horizontal CCD barrier layer and barrier layer 18 which requires only modification to the mask pattern allows formation of the barrier layer 18 without increasing the number of steps of preparation; this is a great advantage in the preparation process.

Figure 4:
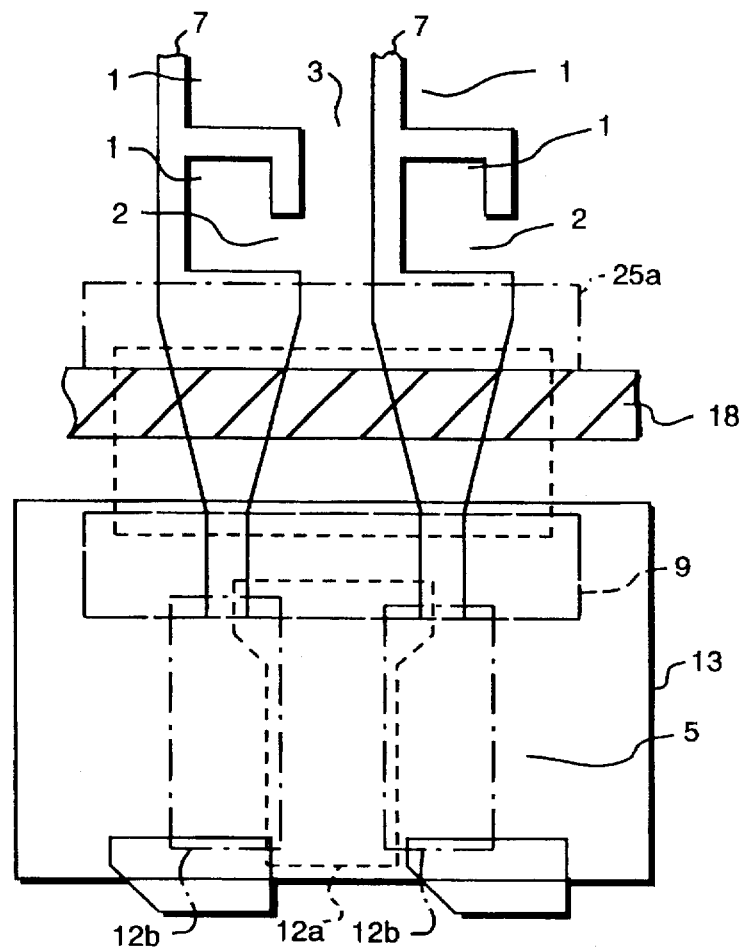
FIG. 4 is a plan view showing connections between the vertical CCDs and horizontal CCDs of Embodiment 2 according to the present invention.
Figure 5:
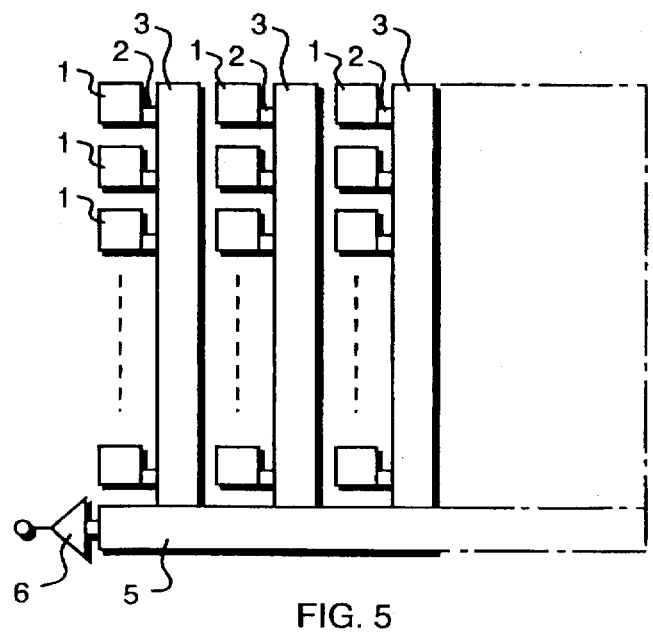
FIG. 5 is a schematic plan view illustrating the subject matter for ITCCD apparatuses.
Figure 6:
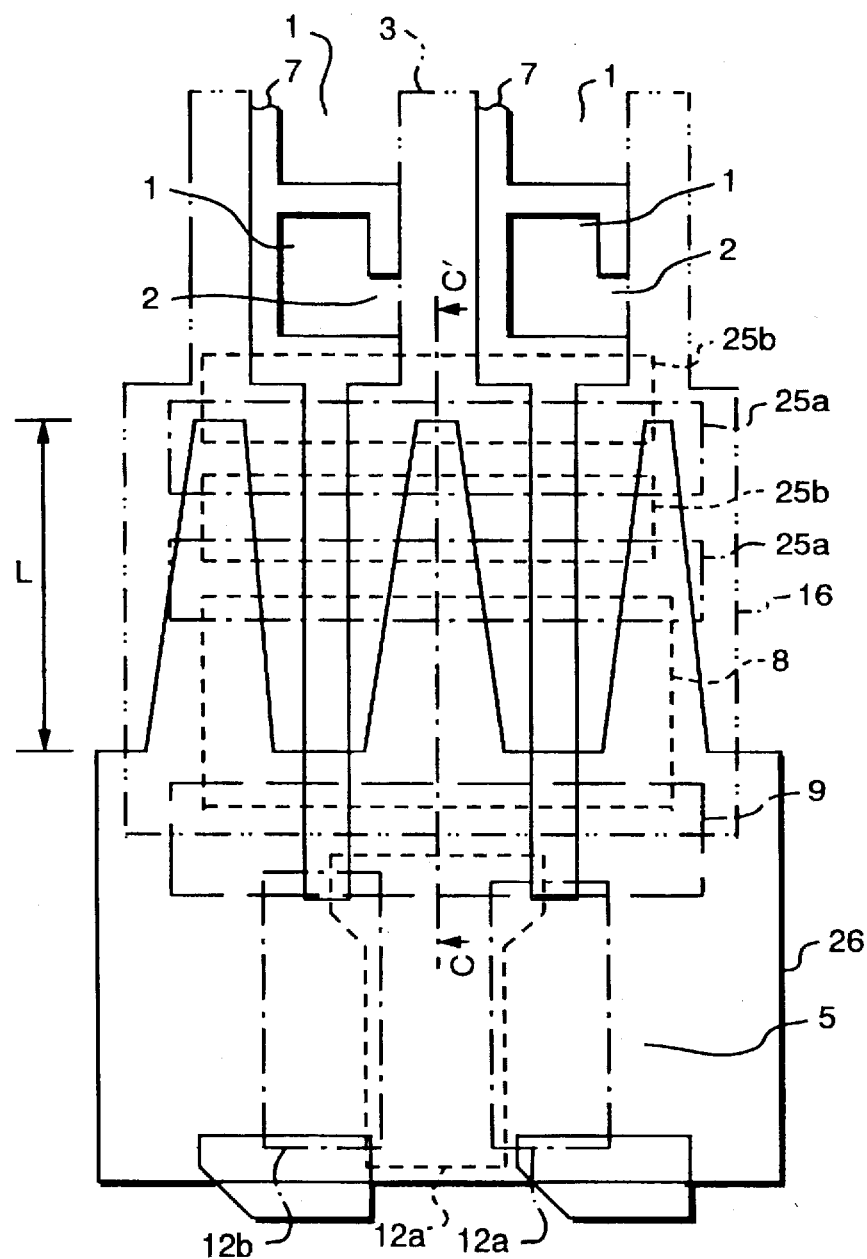
FIG. 6 is a plan view showing connections between the vertical CCDs and horizontal CCDs of an ITCCD apparatus.
Figure 7:
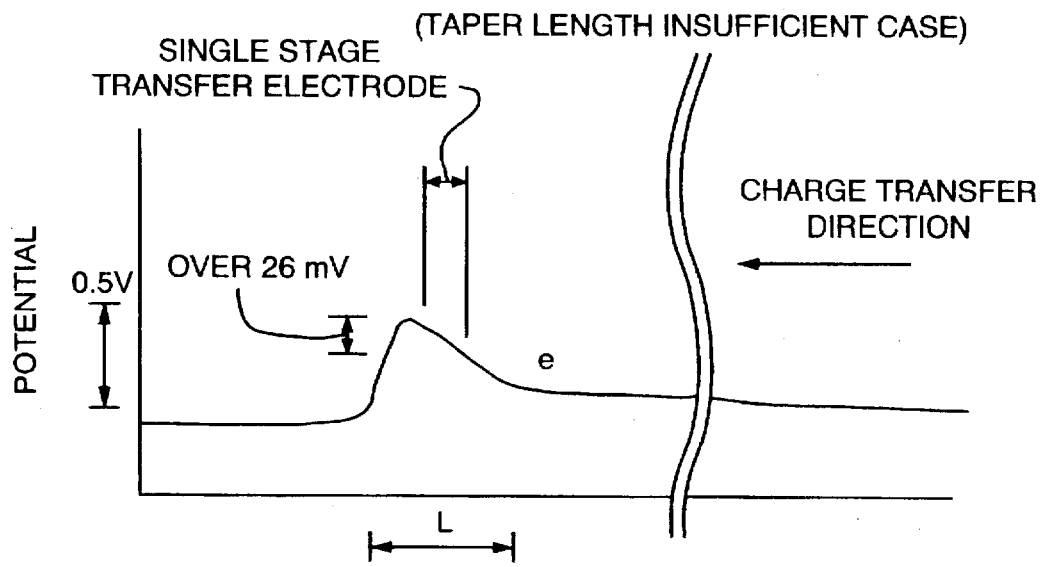
FIG. 7 is a view showing a potential profile of an ITCCD apparatus.
Figure 8:
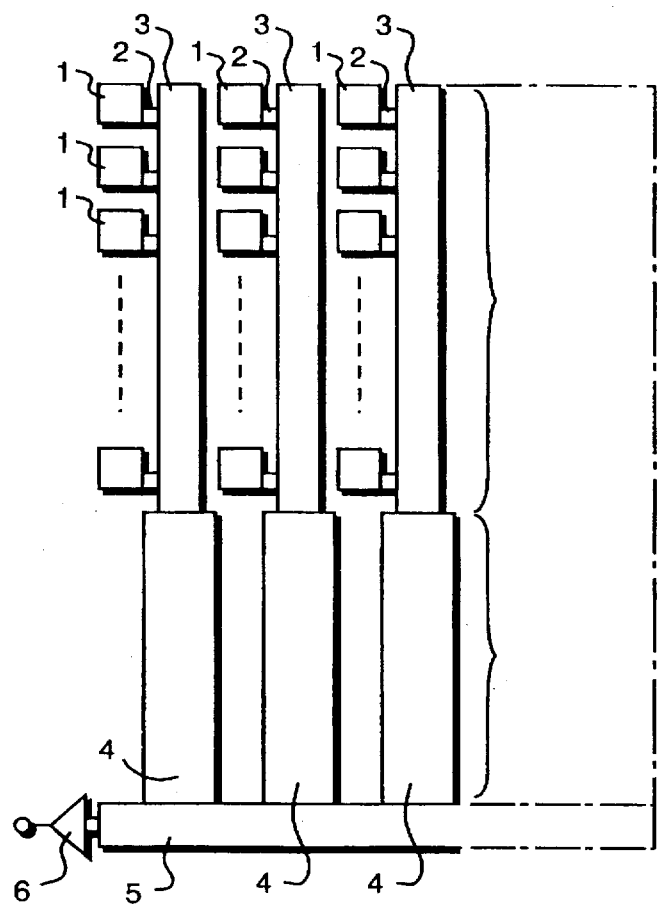
FIG. 8 is a schematic plan view of a conventional FITCCD apparatus.
Figure 9:
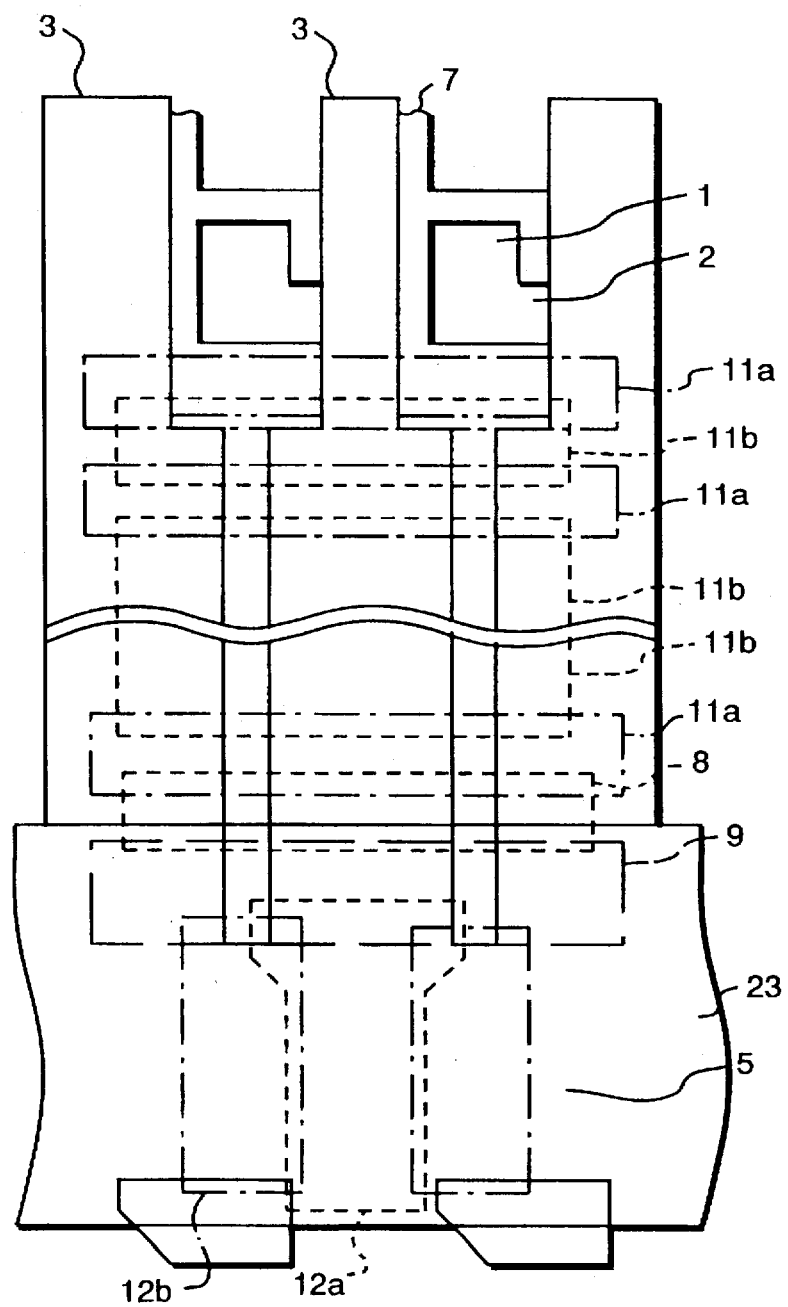
FIG. 9 is a plan view showing connections between the vertical CCDs and horizontal CCDs of a conventional FITCCD apparatus.
Figure 10:
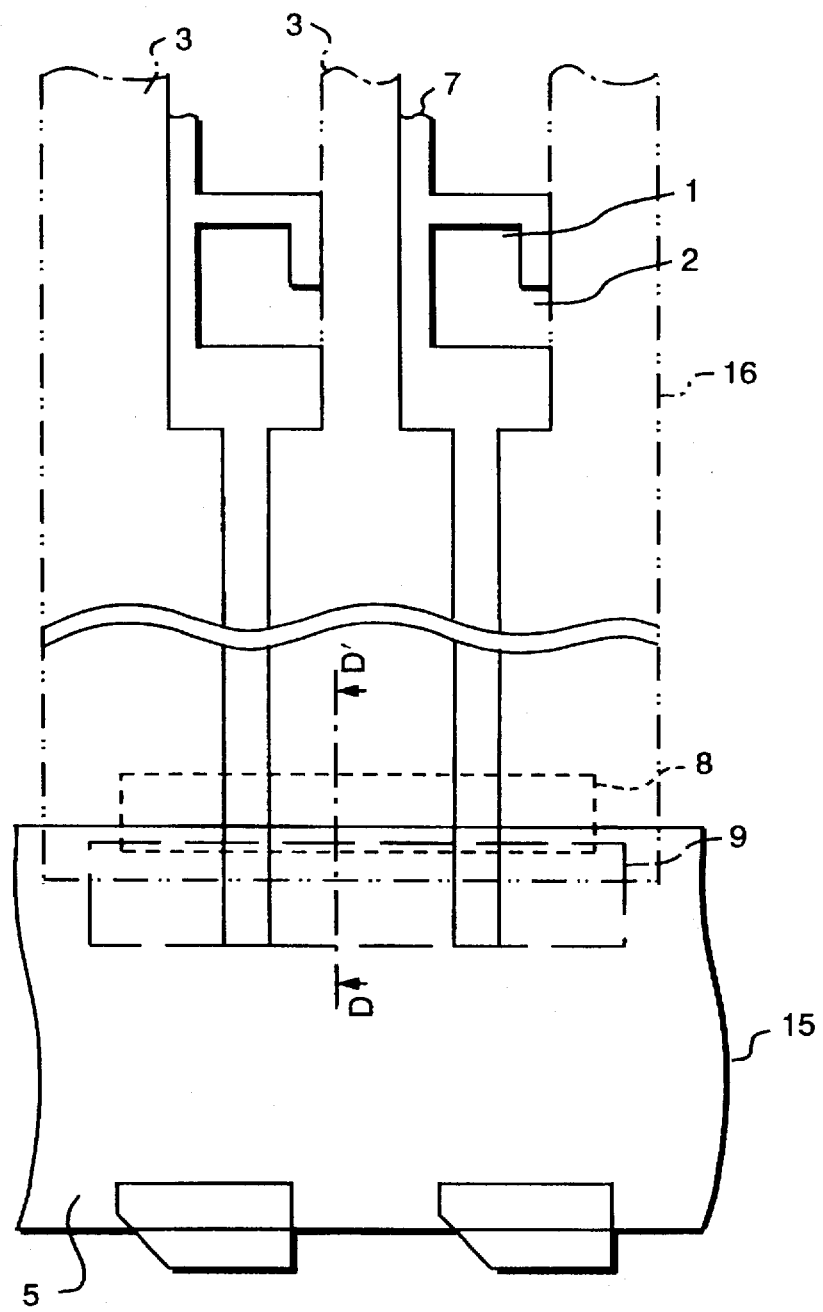
FIG. 10 is a plan view showing connections between the vertical CCDs and horizontal CCDs of a conventional FITCCD apparatus, with p-type well layers designed separately for the vertical CCDs and horizontal CCDs.
Figure 11A:
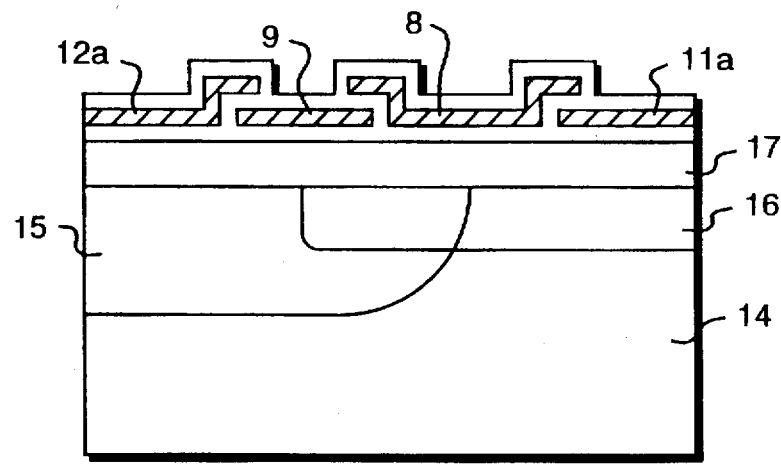
Figure 11B:
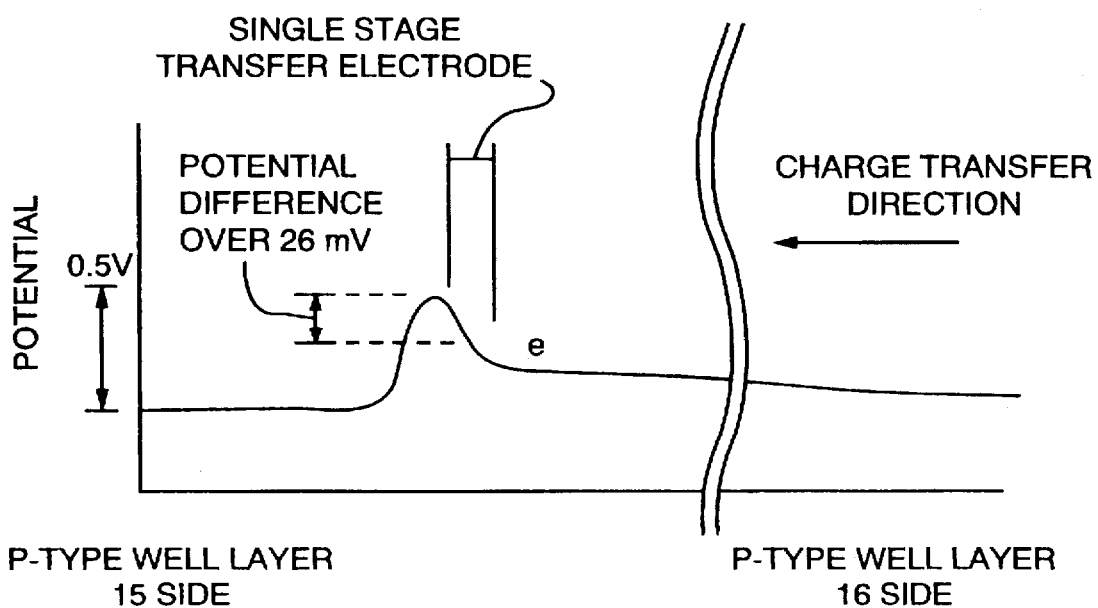
Figure 12:
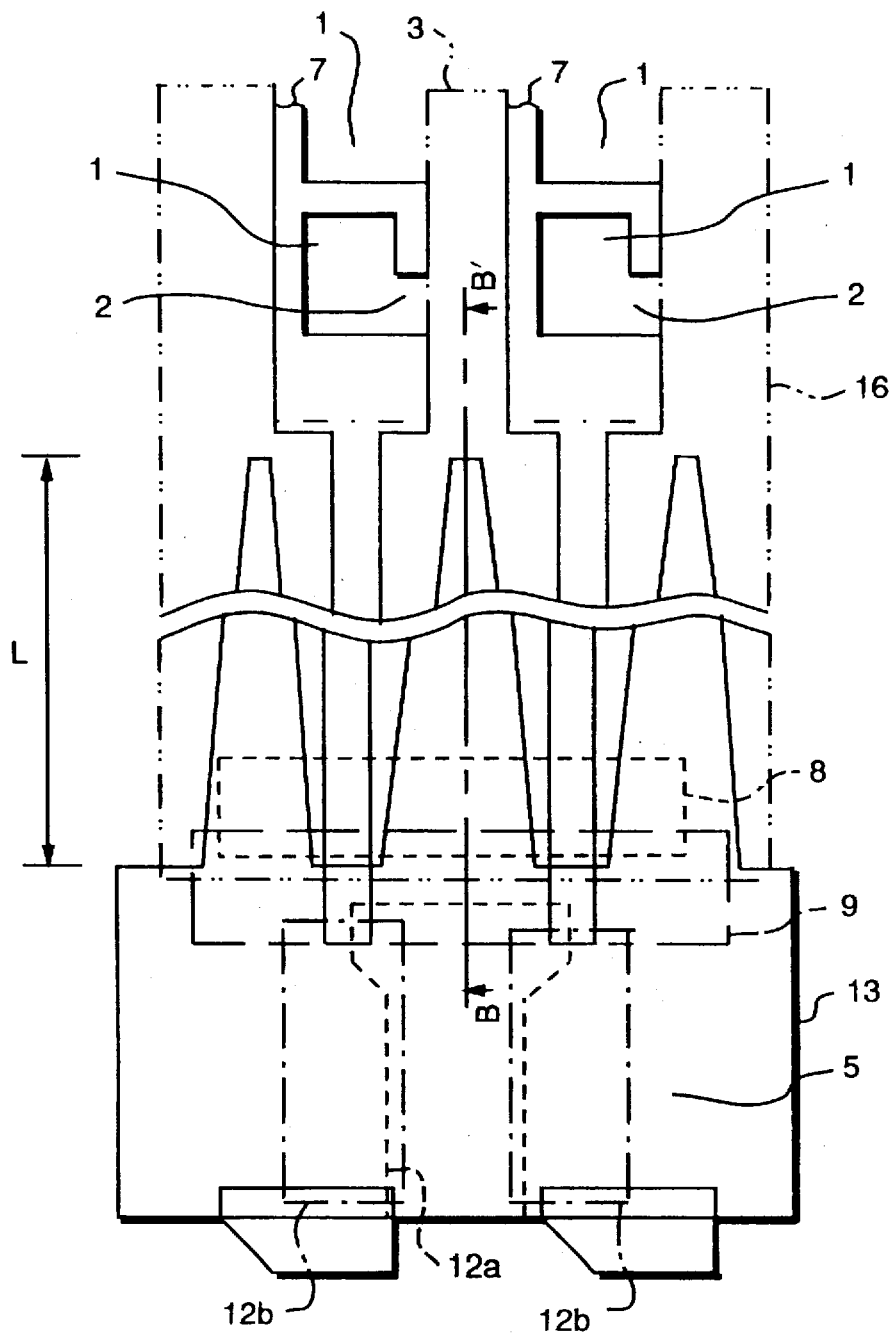
FIG. 12 is a plan view showing connections between the vertical CCDs and horizontal CCDs of another conventional FITCCD apparatus, with a p-type well layer having tapered and branched fronts.
Figure 13:
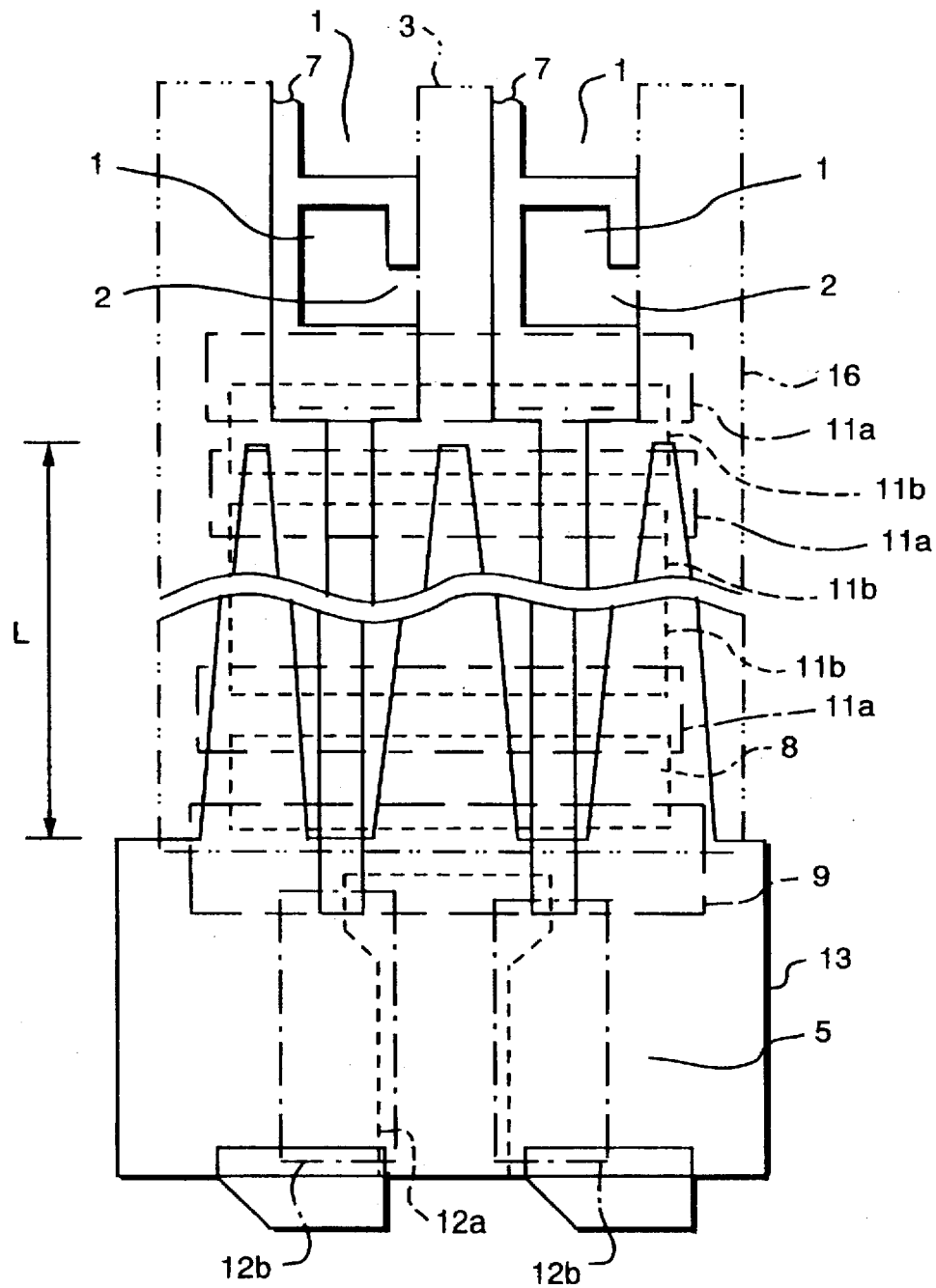
FIG. 13 is a superimposed view of the vertical transfer electrodes 11a and 11b in the memory region upon FIG. 12.
Figure 14A:
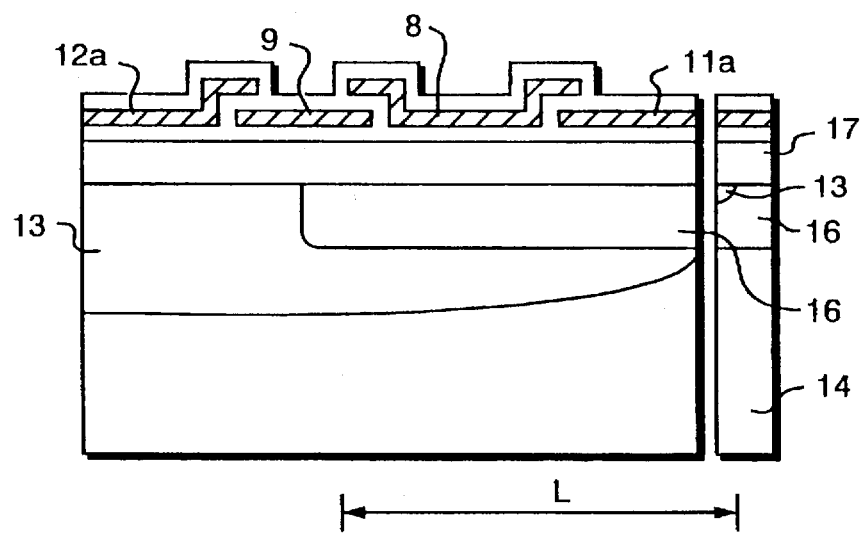
Figure 14B:
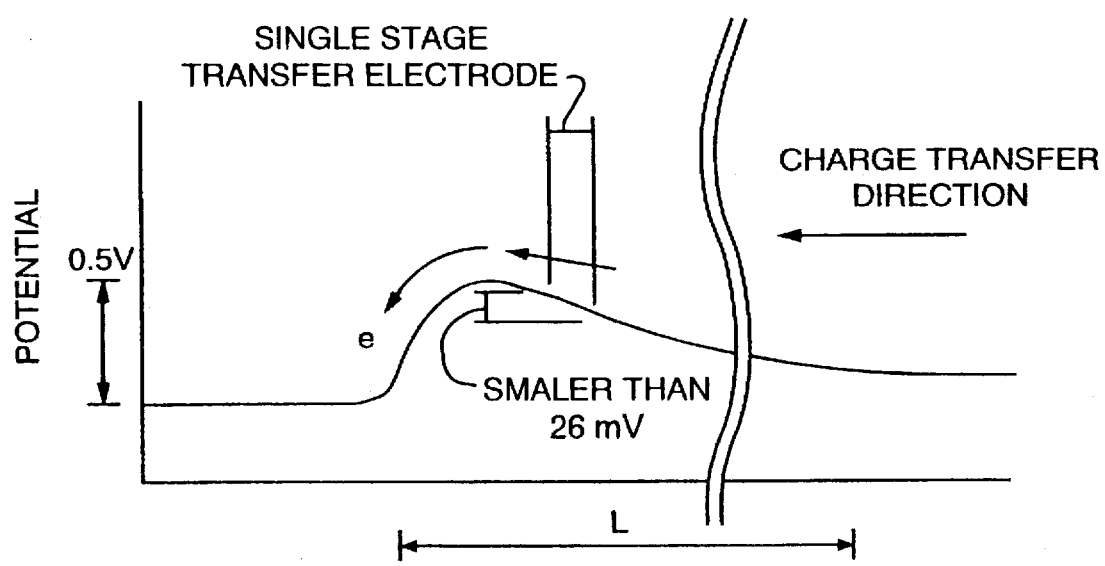

Embodiment 2 according to the present invention will now be explained with reference to FIG. 4 which is a plan view showing connections between the vertical CCDs and horizontal CCDs. In contrast to Embodiment 1, the transfer channel widths for the vertical CCDs 3 increase more moderately. Concretely, the widths start to increase gradually at the margin of the image pickup region (here the midpoint between the transfer electrodes 25a) toward the transfer gates 9. Various factors make it difficult to match the channel widths for the vertical CCDs in the image pickup region with the channel widths for the horizontal CCDs at the input side. Therefore, transfer channels with different widths must be connected to each other. Steep changes in the transfer channel widths do not contribute to a lower potential profile, but instead produce a barrier, and thus it is desired to taper the channels to allow the transfer channel widths to change moderately. The present embodiment is more effective than Embodiment 1 in minimizing the change in the transfer channel widths between the image pickup region and the horizontal CCDs. Only moderate increase in the transfer channel widths without provision of the barrier layer 18 allows the potential profile to be gradually lowered in the direction of transfer, but this is less effective than provision of the barrier layer 18. The combination of the moderate increase in the widths with provision of the barrier layer 18 according to the present embodiment lowers the potential profile in the direction of transfer more than provision of the barrier layer 18 alone.

Figure 15:
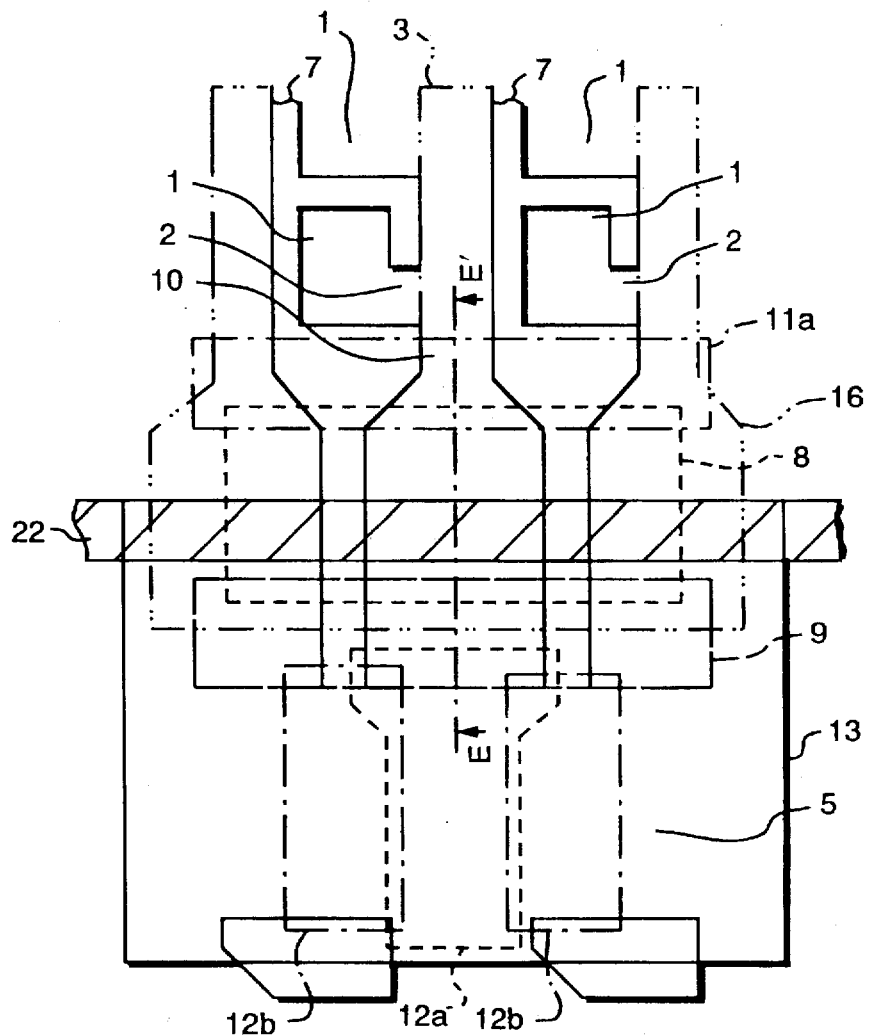
Figure 15:
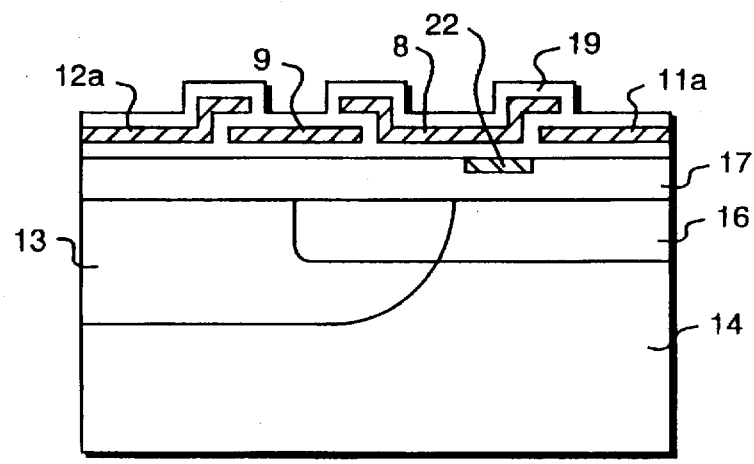

Embodiment 3 will now be explained with reference to FIG. 15. FIG. 15(a) is a plan view showing connections between the vertical CCDs and horizontal CCDs, while FIG. 15(b) is a cross-sectional view taken on line E—E' in FIG. 15(a). The only difference from Embodiment 1 is that a barrier layer 22 is provided instead of the barrier layer 18. More specifically, the barrier layer is provided, not at the vertical CCD side of the well overlap section, but in the well overlap section. In this case, however, the impurity concentration of the barrier layer 22 is required to be higher, not lower than that of the N-type buried layer 17, but rather to be higher. To accomplish this, an N-type impurity may be introduced into the region of the barrier layer 22. As the result of this introduction, the potential is lowered at the shoulder portion to the left of the potential falling region marked with the broken line in FIG. 2, or the bulging portion in the direction of charge transfer, thereby eliminating the falling portion which may entrap the charges. In this way, the charges can no longer blocked from transfer even in the well overlap section. However, since the potential gradient in the direction of charge transfer is more moderate than according to Embodiment 1 in which the falling portion is raised, the force attracting the charges toward the horizontal CCD side is lessened. This means that the barrier layer 22, when used alone, contributes less to the improved transfer efficiency than the barrier layer 18. Combined use of both the barrier layer 18 and barrier layer 22, however, not only raises the falling portion, but eliminates the shoulder portion mentioned above, resulting in an increased degree of descent of the potential, which in turn leads to a higher transfer efficiency as well as an increased transfer rate.

Figure 16:
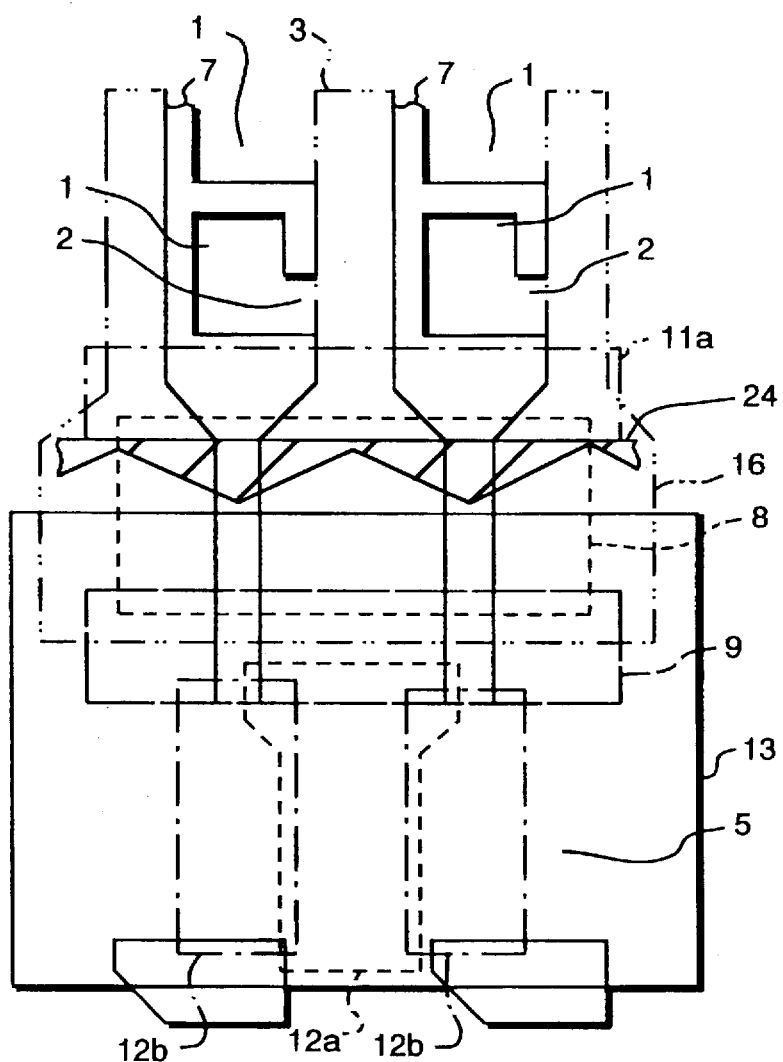
FIG. 16 is a plan view showing connections between the vertical CCDs and horizontal CCDs of Embodiment 4 according to the present invention.

The following is an explanation of Embodiment 4 with reference to FIG. 16 which is a plan view showing connections between the vertical CCDs and horizontal CCDs. A difference from Embodiment 1 resides in that the planar form of the barrier layer 18 is not rectangular, but triangular. According to the present embodiment, although the potential-falling portion cannot be raised higher than with the rectangular barrier layer 18, the falling portion may be eliminated to form a horizontal potential profile. Accordingly, no charges are entrapped, and transfer failure is not caused. In order to increase the charge transfer efficiency, however, the most appropriate planar form of the barrier layer is a rectangle.

Figure 17:
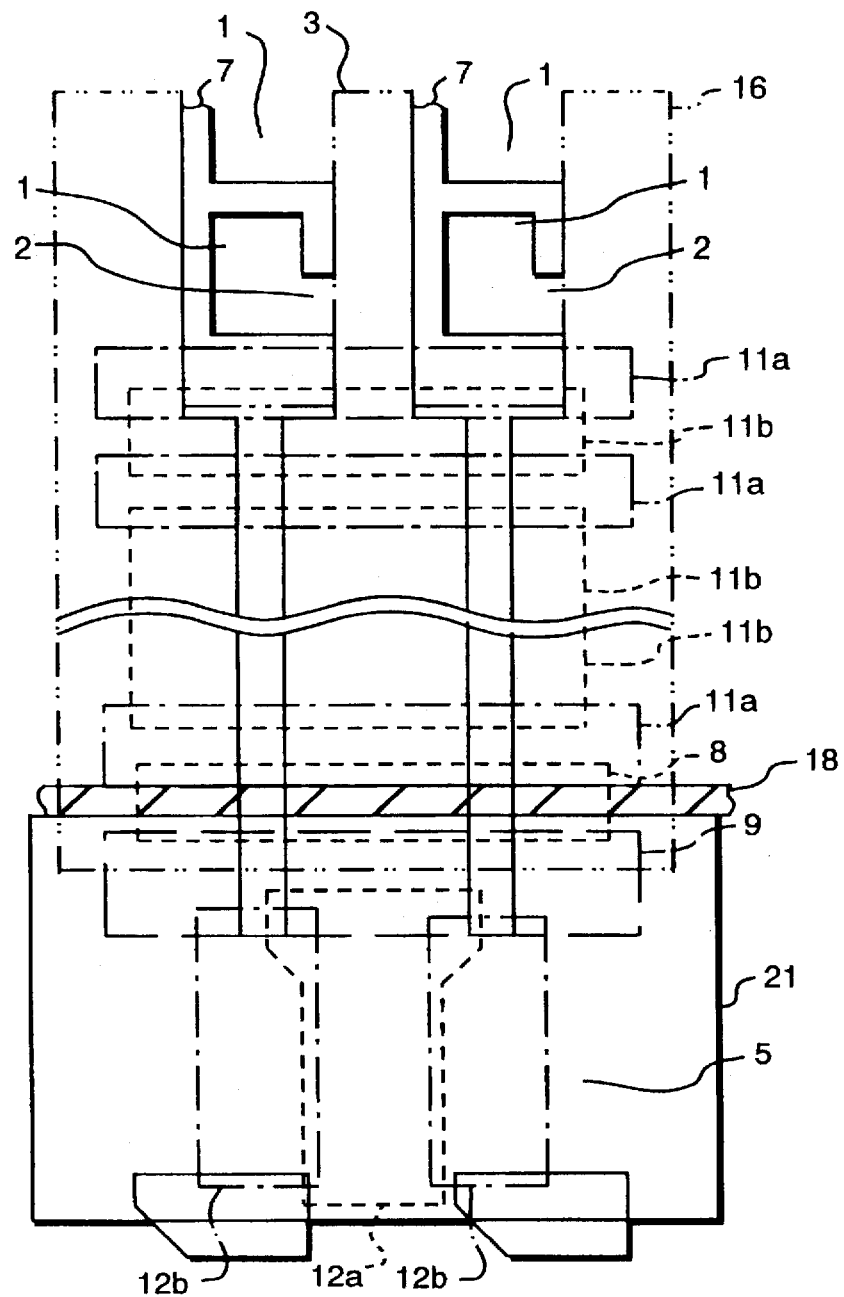
FIG. 17 is a plan view showing connections between the vertical CCDs and horizontal CCDs of Embodiment 5 according to the present invention.

An explanation will now be given regarding Embodiment 5 with reference to FIG. 17 which is a plan view showing connections between the vertical CCDs and horizontal CCDs. The present embodiment is illustrative of application of the barrier layer 18 to FITCCD apparatuses. The p-type well layer 21 for the horizontal CCDs 5 is not tapered to penetrate deeply into the memory region, but rather extends only up to the terminal vertical CCD electrodes 8 in the same manner as in the case of ITCCD apparatuses. Therefore, the region overlapping with the P-type well layer 16 for the vertical CCDs is located, as in Embodiment 1, under the terminal vertical CCD electrodes 8 and transfer gates 9. For this reason, the potential profile is the same as according to Embodiment 1. In brief, the conventional structure wherein the well layer for the horizontal CCDs is tapered and penetrated into the memory region is adapted to overcome the potential barrier of 0.5 volts by dividing the 0.5-volt potential barrier into potential barriers of smaller than 26 mV and overcoming the smaller barriers one by one. Therefore, although certainly no transfer failure is caused, there definitely exists a potential barrier, though it is smaller than 26 mV. Because of this barrier, the transfer rate could not have increased beyond a certain ceiling. According to the embodiments of the present invention, however, not only may potential barriers of 26 mV or smaller be eliminated, but a potential profile which descends gradually in the direction of transfer may be formed, for which reason the charges to be transferred are strongly attracted toward the horizontal CCD side, resulting in an higher transfer rate and greater performance of FITCCD apparatuses.

As explained above, according to the present invention, separate well layers may be designed for each of the vertical CCDs and horizontal CCDs, without causing transfer failure, for ITCCD apparatuses with no memory region, thus increasing charges per unit area, improving the sensitivity and achieving high degrees of efficiency even for high-speed transfer. In addition, since the overlap section between the vertical CCDs and horizontal CCDs may be provided under the terminal vertical CCD electrodes and transfer gates, there is no need to increase the chip size. Furthermore, since the potential profile is allowed to descend gradually in the direction of charge transfer, the charges may be strongly attracted toward the horizontal CCD side thereby increasing the rate of transfer from the vertical CCDs to the horizontal CCDs. Additionally, a barrier layer for controlling the potential profile may be readily formed by any well known ion-implantation technique. In the case of two-channel-system horizontal CCDs, an additional barrier layer may be formed simultaneously with the barrier layer for the horizontal CCDs, and thus there in no increase in the number of steps of preparation. Furthermore, even with FITCCD apparatuses, the transfer rate and thus the transfer efficiency may be increased to improve the performance of FITCCD apparatuses. For the foregoing reasons, the present invention may provide ITCCD apparatuses and FITCCD apparatuses which produce high picture quality characteristic of the HDTV system.

What is claimed is:

1. A solid state image pick up device comprising:
   a plurality of photoelectric conversion elements producing signal charges in response to light applied thereto;
   a vertical charge transfer part including a first region having a first well layer and transferring said signal charges produced by said photoelectric conversion elements;
   a horizontal charge transfer part including a second region having a second well layer and coupled to said vertical charge transfer part to receive signal charges transferred from said vertical charge transfer part by using a terminal vertical transfer electrode of said vertical charge transfer part, said first and second well layers being partially overlapped to form an overlap section without extending over said terminal vertical transfer electrode in a direction from said second region to said first region; and
   a barrier layer selectively formed adjacent said first region to allow a potential to descend gradually in a direction from said first region to said second region.

2. A solid state image pick up device as claimed in claim 1, wherein said barrier layer is located under said terminal vertical transfer electrode.

3. A solid state image pick up device as claimed in claim 1, wherein said barrier layer is located over said overlap section.

4. A solid state image pick up device as claimed in claim 1, wherein said first region has an end portion formed with a width which increases toward said horizontal charge transfer part.

5. A solid state image pickup device comprising:
   a plurality of photoelectric conversion elements arranged in a matrix having rows and columns;
   a plurality of vertical charge transfer parts each provided between adjacent columns of said matrix to transfer signal charges derived from associated ones of said photoelectric conversion elements, each of said vertical charge transfer parts including a first channel region formed on a first well layer;
   a horizontal charge transfer part coupled to said vertical charge transfer parts to receive signal charges transferred from said vertical charge transfer parts by using a terminal vertical transfer electrode of said vertical charge transfer parts, said horizontal charge transfer part having a second channel region coupled to said first channel region of each of said vertical charge transfer parts, said second channel region being formed on a second well layer, said second well layer and said first well layer being partially overlapped to form an overlap section without extending over said terminal vertical transfer electrode and having a rectangular planar form; and
   a barrier layer provided between each of said vertical charge transfer parts and said horizontal charge transfer part to lower a potential gradually in a direction from said first channel region to said second channel region.

6. A solid state image pick up device as claimed in claim 5, wherein said first channel region has a plurality of end portions associated with said vertical charge transfer parts, each said end portion formed with a width which increases toward said horizontal charge transfer part.

7. A charge transfer image pick-up device comprising:
   a semiconductor substrate of one conductivity type and vertical and horizontal charge transfer parts with electrodes including vertical transfer electrodes, a terminal vertical transfer electrode, a transfer gate electrode and horizontal transfer electrodes, said vertical charge transfer part including a first well layer of opposite conductivity type formed in said semiconductor substrate and a buried layer of said one conductivity type formed in said first well layer, said horizontal charge transfer part being constituted with a second well layer of opposite conductivity type formed in said semiconductor substrate and said buried layer formed in said second well layer, said first and second well layers being overlapped with each other to form an overlap section between said vertical and horizontal charge transfer parts such that said overlap section is located under said terminal vertical transfer electrode and said transfer gate electrode, said vertical transfer part having a channel-width-enlarged portion increasing widthwise toward said terminal vertical electrode; and a barrier layer formed adjacent said first well layer under said terminal vertical transfer electrode and thereby allowing a potential profile to descend gradually in a direction of charge transfer such that charges are strongly attracted toward said horizontal charge transfer part from said vertical charge transfer part.

8. A charge transfer image pick up device as claimed in claim 7, wherein said barrier layer is located over said overlap section.

9. A charge transfer image pick up device as claimed in claim 7, wherein said barrier layer having a triangular planar form.

10. A solid state image pick up device as claimed in claim 7, wherein said barrier layer has said one conductivity type with impurity concentration lower than that of said buried layer.

11. An interline type charge transfer image pick-up device comprising:

a semiconductor substrate of one conductivity type and vertical and horizontal charge transfer parts with electrodes including vertical transfer electrodes, a terminal vertical transfer electrode, a transfer gate electrode and horizontal transfer electrodes, said vertical charge transfer part including a first well layer of opposite conductivity type formed in said semiconductor substrate and a buried layer of said one conductivity type formed over said first well layer, said horizontal charge transfer part including a second well layer of opposite conductivity type formed in said semiconductor substrate and said buried layer formed over said second well layer, said second well layer being deeper than said first well layer and said first and second well layers being overlapped with each other to form an overlap section between said vertical and horizontal charge transfer parts such that said overlap section is located under said terminal vertical transfer electrode and said transfer gate electrode without extending over said terminal vertical transfer electrodes, said vertical charge transfer part having a channel-width-enlarged portion increasing widthwise toward said overlap section; and a barrier layer formed in said buried layer under said terminal vertical transfer electrode and thereby allowing a potential profile to descend gradually in a direction of charge transfer such that charges are not blocked from transfer even in said overlap section.

12. An interline type charge transfer image pick-up device comprising:

a semiconductor substrate of one conductivity type and vertical and horizontal charge transfer parts with electrodes including vertical transfer electrodes, a terminal vertical transfer electrode, transfer gate electrode and horizontal transfer electrodes, said vertical charge transfer part including a first well layer of opposite conductivity type formed in said semiconductor substrate and a buried layer of said one conductivity type formed over said first well layer, said horizontal charge transfer part including a second well layer of opposite conductivity type formed over said semiconductor substrate and said buried layer formed in said second well layer, said second well layer being deeper than said first well layer and said first and second well layers being overlapped to form an overlap section between said vertical and horizontal charge transfer parts; and a barrier layer formed in said buried layer under said terminal vertical transfer electrode, said barrier layer having said one conductivity with impurity concentration lower than that of said buried layer and thereby allowing a potential profile to descend gradually in a direction of charge transfer such that charges are not blocked from transfer even in said overlap section.

13. A solid state image pick up device as claimed in claim 12, wherein said vertical charge transfer part has a channel-width-enlarged portion increasing widthwise toward said overlap section.

14. A solid state image pick up device as claimed in claim 12, wherein said overlap section is located under said terminal vertical transfer electrode and said transfer gate electrode without extending over said terminal vertical transfer electrodes.

* * * * *